US009451700B2

(12) United States Patent
Otsubo

(10) Patent No.: US 9,451,700 B2
(45) Date of Patent: Sep. 20, 2016

(54) METHOD FOR PRODUCING MULTI-LAYER SUBSTRATE AND MULTI-LAYER SUBSTRATE

(71) Applicant: Murata Manufacturing Co., Ltd., Kyoto (JP)

(72) Inventor: Yoshihito Otsubo, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/094,240

(22) Filed: Dec. 2, 2013

(65) Prior Publication Data

US 2014/0085843 A1    Mar. 27, 2014

Related U.S. Application Data

(63) Continuation of application No. PCT/JP2012/064044, filed on May 31, 2012.

(30) Foreign Application Priority Data

Jun. 3, 2011    (JP) .................................. 2011-125003

(51) Int. Cl.
*H05K 3/28*    (2006.01)
*H05K 1/18*    (2006.01)
(Continued)

(52) U.S. Cl.
CPC .............. *H05K 1/181* (2013.01); *H01L 21/561* (2013.01); *H01L 23/13* (2013.01);
(Continued)

(58) Field of Classification Search
CPC ........... H01L 2224/97; H01L 2224/81; H01L 21/561; H01L 2224/16225; H01L 23/13; H01L 23/295; H01L 23/3107; H01L 23/49811; H01L 23/49822; H01L 23/552; H01L 24/16; H01L 24/97; H01L 2924/014; H05K 1/0271; H05K 1/181; H05K 2201/09063; H05K 2201/10318; H05K 2203/1316; H05K 2203/1572; H05K 3/0097; H05K 3/284; H05K 3/303
USPC ................................................ 427/96.2, 96.3
See application file for complete search history.

(56) References Cited

U.S. PATENT DOCUMENTS

2004/0126547 A1* 7/2004 Coomer .............. H01L 21/4857 428/209
2011/0006106 A1* 1/2011 Kanryo et al. ................ 228/170

FOREIGN PATENT DOCUMENTS

JP    S59-109173 U    7/1984
JP    2001-135920 A    5/2001
(Continued)

OTHER PUBLICATIONS

Machine translation of Maruyama et al. JP 2001-135920A.*
(Continued)

*Primary Examiner* — Dah-Wei D Yuan
*Assistant Examiner* — Jose Hernandez-Diaz
(74) *Attorney, Agent, or Firm* — Pearne & Gordon LLP

(57) ABSTRACT

A mounting-completed core parent substrate in which surface mount devices are mounted on both principal surfaces of the core parent substrate including a plurality of the core individual substrates and having a through hole formed in each core individual substrate so as to extend therethrough is formed. Then, resin layers in a partially cured state are formed on both the principal surfaces of the core parent substrate and the resin layers on both the principal surfaces are joined through the through holes so that the resin layers on both principal surfaces of each core individual substrate are joined and integrated to each other at a predetermined region, each core individual substrate being obtained by dividing the core parent substrate. After that, the resin layers are subjected to main curing. Thereafter, the core parent substrate is divided at a predetermined position and separated into the core individual substrates.

4 Claims, 10 Drawing Sheets

(51) Int. Cl.
*H01L 21/56* (2006.01)
*H01L 23/13* (2006.01)
*H01L 23/31* (2006.01)
*H01L 23/498* (2006.01)
*H01L 23/00* (2006.01)
*H05K 3/30* (2006.01)
*H05K 1/02* (2006.01)
*H01L 23/29* (2006.01)
*H01L 23/552* (2006.01)
*H05K 3/00* (2006.01)

(52) U.S. Cl.
CPC .... H01L 23/3107 (2013.01); H01L 23/49811 (2013.01); H01L 24/97 (2013.01); H05K 3/284 (2013.01); H05K 3/303 (2013.01); *H01L 23/295* (2013.01); *H01L 23/49822* (2013.01); *H01L 23/552* (2013.01); *H01L 24/16* (2013.01); *H01L 2224/16225* (2013.01); *H01L 2224/97* (2013.01); *H01L 2924/014* (2013.01); *H01L 2924/12042* (2013.01); *H01L 2924/1532* (2013.01); *H01L 2924/15162* (2013.01); *H01L 2924/15787* (2013.01); *H01L 2924/19041* (2013.01); *H01L 2924/19106* (2013.01); *H01L 2924/3511* (2013.01); *H05K 1/0271* (2013.01); *H05K 3/0097* (2013.01); *H05K 2201/09063* (2013.01); *H05K 2201/10318* (2013.01); *H05K 2203/1316* (2013.01); *H05K 2203/1572* (2013.01); *Y10T 29/4913* (2015.01)

(56) References Cited

FOREIGN PATENT DOCUMENTS

| JP | 2001135920 A | * | 5/2001 |
|----|--------------|---|--------|
| JP | 2003-086925 A | | 3/2003 |
| JP | 2003-112335 A | | 4/2003 |
| JP | 2005-191090 A | | 7/2005 |
| JP | 2005-311201 A | | 11/2005 |
| JP | 2008-166603 A | | 7/2008 |
| JP | 2008-277392 A | | 11/2008 |
| JP | 2009-188218 A | | 8/2009 |
| JP | 2010-016291 A | | 1/2010 |
| WO | 2005/078796 A1 | | 8/2005 |
| WO | 2009/066504 A1 | | 5/2009 |
| WO | 2009/139121 A1 | | 11/2009 |

OTHER PUBLICATIONS

International Search Report for Application No. PCT/JP2012/064044 dated Jul. 10, 2012.
English Translation of the Written opinion of the International Search Authority for PCT/2012/064044 dated Jul. 10, 2012.

* cited by examiner

METHOD FOR PRODUCING MULTI-LAYER SUBSTRATE AND MULTI-LAYER SUBSTRATE

BACKGROUND OF THE INVENTION

1. Field of the Invention

The present invention relates to a multi-layer substrate and a method for producing the multi-layer substrate. More specifically, the present invention relates to a multi-layer substrate having a structure in which both principal surfaces of a core substrate on which surface mount devices are mounted are sealed with sealing resin layers, and to a method for producing the multi-layer substrate.

2. Description of the Related Art

As one multi-layer substrate, a multi-layer substrate having a structure such as that shown in FIG. 14 is proposed. As shown in FIG. 14, the multi-layer substrate includes a core substrate (ceramic multi-layer substrate) including a plurality of laminated ceramic layers. An active chip component 140, such as a semiconductor device, is disposed on one of principal surfaces of the core substrate 110, and a passive chip component 150, such as a capacitor, is disposed on the other principal surface of the core substrate 110.

Sealing resin layers 120 and 130 are formed on the corresponding principal surfaces of the core substrate (ceramic multi-layer substrate) 110. A surface electrode 121 and a via conductor 122 are formed on a lower surface of the resin layer 130.

As with this multi-layer substrate, in a multi-layer substrate having a structure in which the sealing layers 120 and 130 seal the corresponding principal surfaces of the core substrate (ceramic multi-layer substrate) 110, the core substrate 110 is warped due to a difference between the expansion/contraction coefficient of the core substrate 110 and the expansion/contraction coefficient of the resin layer 120 and the expansion/contraction coefficient of the core substrate 110 and the expansion/contraction coefficient of the resin layer 130 in a resin curing step when forming the resin layers 120 and 130. This reduces the reliability with which a multi-layer substrate is mounted on, for example, a module substrate, and, depending upon the circumstances, causes disconnection of a conductor provided on the multi-layer substrate.

Thermal stress between the core substrate 110 and the resin layer 120 and between the core substrate 110 and the resin layer 130 may cause peeling between the core substrate 110 and the resin layer 120 and the core substrate 110 and the resin layer 130.

Patent Document 1: Japanese Unexamined Patent Application Publication No. 2009-188218

BRIEF SUMMARY OF THE INVENTION

The present invention makes it possible to overcome the above-described problems and provides a method for producing a multi-layer substrate that allows a highly reliable unwarped multi-layer substrate to be reliably produced by suppressing the occurrence of warping in a resin layer curing step when producing the multi-layer substrate having a structure in which both principal surfaces of a core substrate are sealed with sealing resin layers.

To overcome the above-described problems, according to the present invention, there is provided a method for producing a multi-layer substrate including sealing resin layers disposed on both principal surfaces of a core individual substrate, the method including:

(a) a step of forming a mounting-completed core parent substrate in which surface mount devices to be sealed by the sealing layers are mounted on both the principal surfaces of the core parent substrate including a plurality of the core individual substrates and having a through hole formed in each core individual substrate so as to extend therethrough;

(b) a step of forming the resin layers by forming the resin layers in a partially cured state on both the principal surfaces of the core parent substrate and joining the resin layers on both the principal surfaces via the through hole so that the resin layers on both the principal surfaces of each core individual substrate are joined and integrated to each other at a predetermined region, each core individual substrate being obtained by a step below of dividing the core parent substrate;

(c) a step of curing the resin layers by subjecting the partially cured resin layers formed on the core parent substrate to main curing; and (d) the dividing step of separating the core parent substrate into each individual core individual substrate by dividing at a predetermined position the core parent substrate provided with the resin layers subjected to the main curing in the step of curing the resin layers.

In the present invention, the phrase "having a through hole formed in each core individual substrate so as to extend therethrough" is a broad notion that refers to a case in which a complete through hole extends through a core substrate and to a case in which part of a through hole extends through a core individual substrate (that is, a case in which one through hole extends through a plurality of the core individual substrates).

In the present invention, it is desirable that, in order for the resin layers on both the principal surfaces of each core individual substrate to be joined and integrated to each other at the predetermined region at a peripheral edge portion, each through hole is formed so as to cut away a portion of an outer peripheral edge of the associated core individual substrate included in the core parent substrate.

When this structural feature is provided, the resin layers on both the principal surfaces of each core individual substrate are joined and integrated to each other at a peripheral edge portion. Therefore, it is possible to obtain a highly reliable unwarped multi-layer substrate. In addition, since the central region of each core individual substrate is not used as a region where the resin layers are joined to each other, it is possible to effectively use the central region of each core individual substrate as, for example, a region on which a surface mount device is mounted.

It is desirable that, in order for the resin layers on both the principal surfaces of each core individual substrate to be joined and integrated to each other at a penetration region of the associated core individual substrate, each through hole is formed so as to extend into a region of the associated core individual substrate included in the core parent substrate.

When this structural feature is provided, the resin layers on both the principal surfaces of each core individual substrate are reliably joined and integrated to each other at a penetration portion of the associated core individual substrate. Therefore, it is possible to obtain a highly reliable unwarped multi-layer substrate.

It is desirable that the method for producing a multi-layer substrate further include, between the step (b) of forming the resin layers and the step (c) of curing the resin layers, a step of forming, as division grooves for dividing the core parent substrate into the core individual substrates, grooves extending from a side of the partially cured resin layers to the core parent substrate.

When this structural feature is provided, it is possible to efficiently divide the core parent substrate into core individual substrates after main curing of the resins, which is desirable.

A multi-layer substrate according to the present invention includes a core individual substrate; surface mount devices mounted on both principal surfaces of the core individual substrate; and resin layers disposed on both the principal surfaces of the core individual substrate so as to seal the surface mount devices, the resin layers being joined and integrated to each other at a predetermined region.

In the multi-layer substrate according to the present invention, it is desirable that the resin layers on both the principal surfaces of the core individual substrate be joined and integrated to each other at a predetermined region at a peripheral edge portion.

When this structural feature is provided, it is possible to obtain a highly reliable unwarped multi-layer substrate in which the resin layers are reliably joined to each other at a peripheral edge portion of the core individual substrate. In addition, since the central region of the core individual substrate is not used as a region where the resin layers are joined to each other, it is possible to effectively use the central region of the core individual substrate as, for example, a region on which a surface mount device is mounted.

It is desirable that the resin layers on both the principal surfaces of the core individual substrate be joined and integrated to each other at a penetration region of the core individual substrate.

When this structural feature is provided, it is possible to obtain a highly reliable unwarped multi-layer substrate in which the resin layers are reliably joined to each other at a penetration portion of the core individual substrate.

According to the method for producing a multi-layer substrate according to the present invention, in the curing step of subjecting the resin layers to main curing, the partially cured resin layers that are positioned on both principal surfaces of each core individual substrate of the core parent substrate and that are in an integrated state are subjected to main curing. Therefore, it is possible to obtain a highly reliable unwarped multi-layer substrate having excellent mountability with respect to a mother board by preventing the warping of each core individual substrate.

Since the resin layers on both principal surfaces of each core individual substrate are joined and integrated to each other, it is possible to obtain a multi-layer substrate whose core individual substrate and resin layers are joined to each other with high reliability.

Since the multi-layer substrate according to the present invention includes resin layers that are disposed on both principal surfaces of each core individual substrate and that are joined and integrated to each other at a predetermined region, it is possible to provide a highly reliable unwarped multi-layer substrate having excellent mountability with respect to a mother board.

Since the resin layers that are disposed on both principal surfaces of each core individual substrate are joined and integrated to each other, it is possible to provide a multi-layer substrate whose core individual substrate and resin layers are joined to each other with high reliability.

Since the resin layers that are disposed on both principal surfaces of each core individual substrate are joined and integrated to each other, when stress is applied to one of the resin layers, the stress is diffused to the other resin layer, so that it is possible to reduce the stress that is applied to each core individual substrate. Consequently, it is possible to suppress splitting or chipping of each core individual substrate, and to suppress variations in the characteristics of the multi-layer substrate.

DETAILED DESCRIPTION OF THE INVENTION

The following embodiments illustrate the features of the present invention in more detail.

First Embodiment

Figure 1:
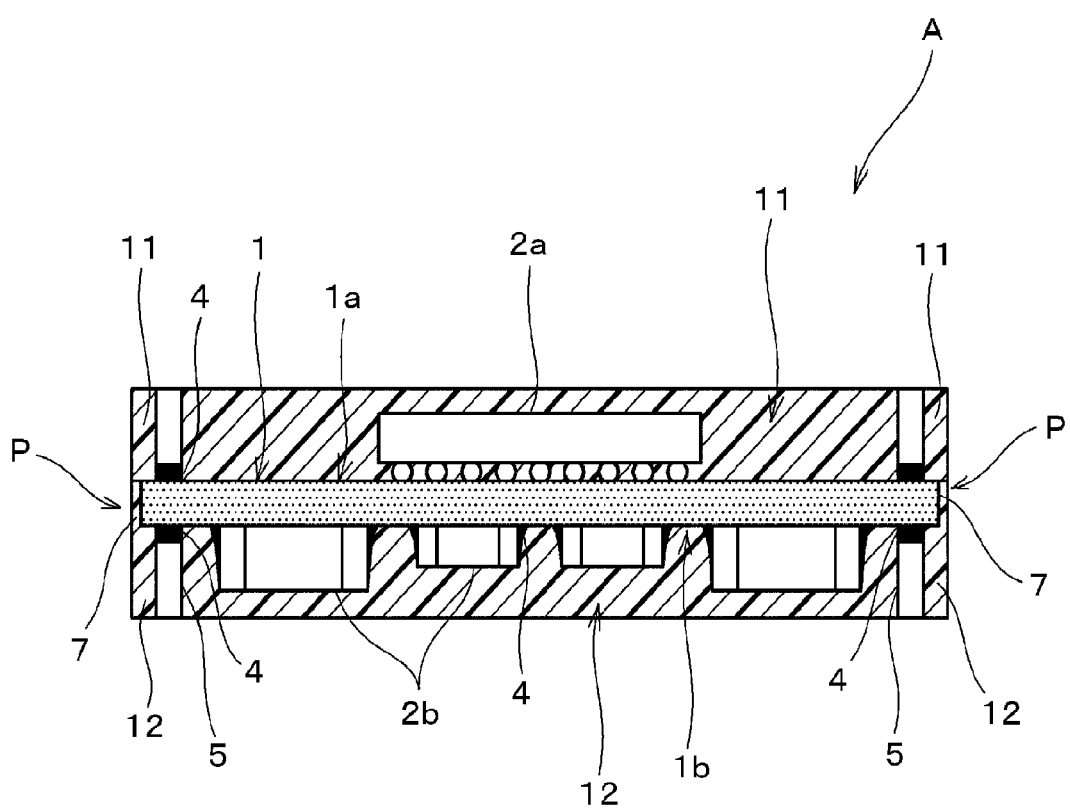
FIG. 1 is a front sectional view of a structure of a multi-layer substrate according to an embodiment (first embodiment) of the present invention.
Figure 2:
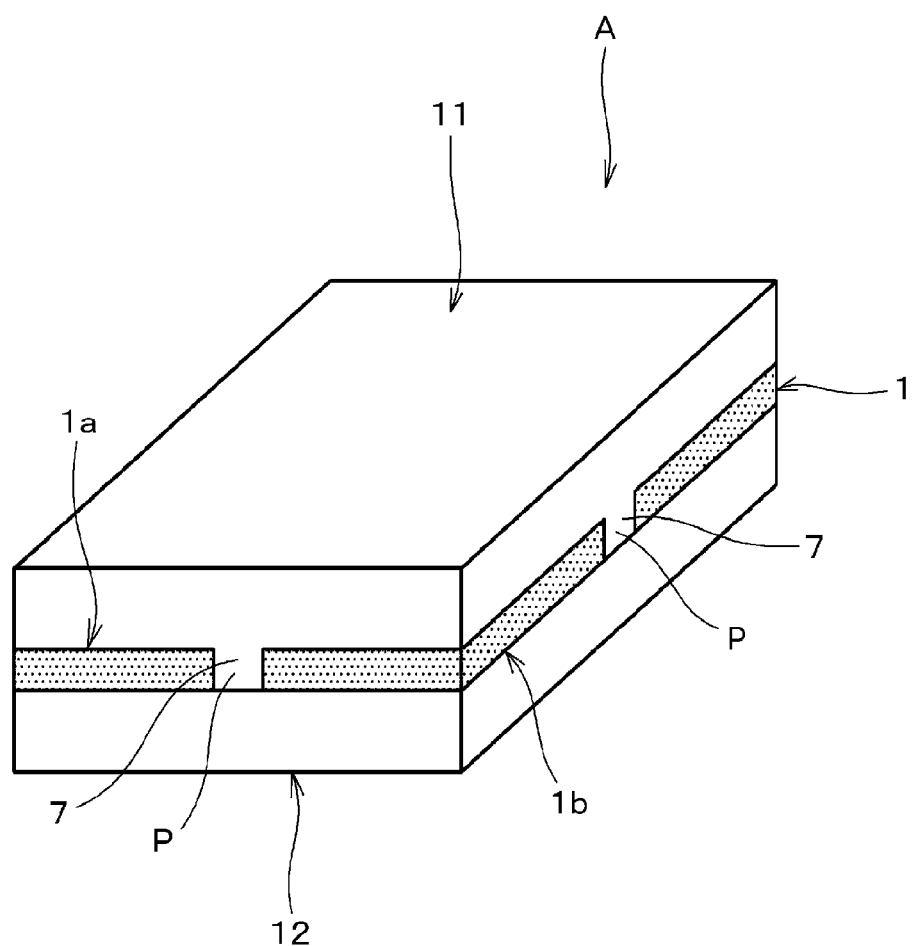
FIG. 2 is a perspective view of the multi-layer substrate according to the first embodiment of the present invention.
Figure 3:
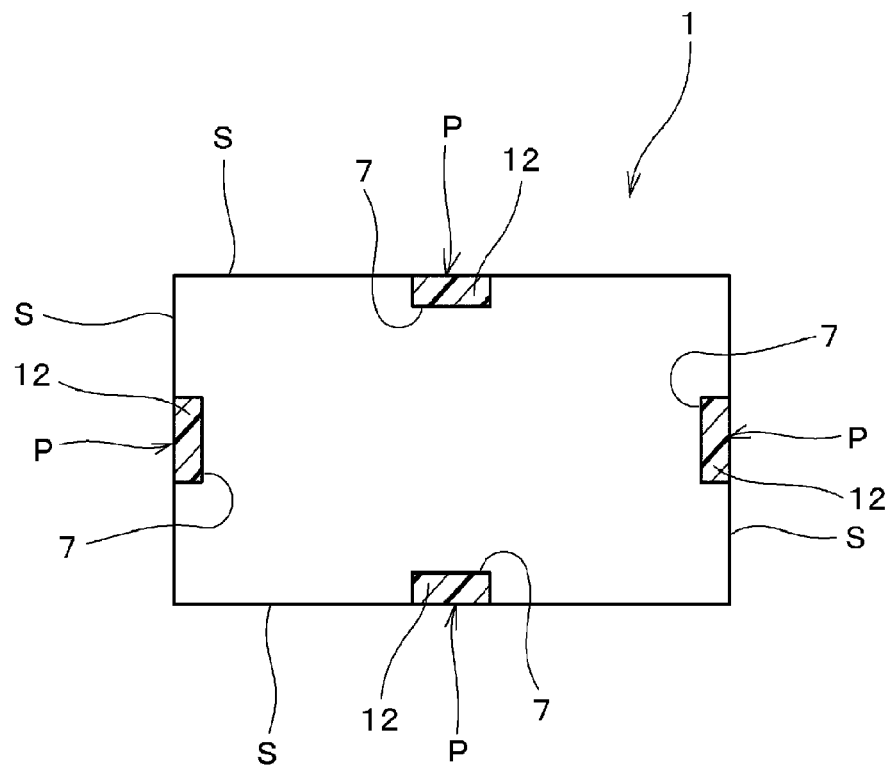
FIG. 3 is a plan sectional view illustrating a mode of arrangement of regions where resin layers are joined in the multi-layer substrate according to the first embodiment of the present invention.

FIG. 1 is a front sectional view of a structure of a multi-layer substrate according to an embodiment (first embodiment) of the present invention. FIG. 2 is a perspective view thereof. FIG. 3 is a plan sectional view illustrating a mode of arrangement of regions where resin layers are joined in the multi-layer substrate according to the first embodiment of the present invention.

As shown in FIGS. 1 and 2, a multi-layer substrate A according to the first embodiment includes a core individual substrate 1, a surface mount device (for example, an active chip component such as a semiconductor device) 2a, a surface mount device (for example, a passive chip component such as a capacitor) 2b, straight terminals 5, both principal surfaces 1a and 1b of the core individual substrate 1, and resin layers 11 and 12. The surface mount device 2a is mounted on the principal surface 1a of the core individual substrate by flip-chip mounting. The surface mount device 2b is mounted on the principal surface 1b by soldering. The straight terminals 5 are connected to the principal surfaces 1a and 1b of the core individual substrate 1 using solder 4. The resin layers 11 and 12 that are substantially equal in thickness are disposed so as to seal, for example, the surface mount device 2a on the principal surface 1a and the surface mount device 2b on the principal surface 1b. End surfaces of the straight terminals 5 are exposed from the resin layers 11 and 12 so as to be connectable to an external device.

In the multi-layer substrate A according to the first embodiment, as shown in FIGS. 1 and 2, the resin layer 11 and the resin layer 12 are joined and integrated to each other at predetermined regions (P) at peripheral edge portions.

More specifically, as shown in FIG. 3, the resin layer 11 and the resin layer 12 are joined and integrated to each other at recessed portions (predetermined regions) P formed at locations corresponding to central portions of corresponding sides S at peripheral edge portions of the resin layers 11 and 12 formed on the corresponding upper and lower principal surfaces of the core individual substrate 1 having a rectangular shape in plan view.

Next, a method for producing the multi-layer substrate A is described with reference to FIGS. 4 to 8.

(1) First, a core parent substrate 10 to be divided into a plurality of core individual substrates 1 (FIG. 1) that form individual multi-layer substrates A (FIG. 1) is provided. Then, through holes 7 serving as regions for joining and integrating the aforementioned resin layers 11 and 12 to each other are formed in the core parent substrate 10.

In this embodiment, as the core parent substrate 10, a ceramic substrate (multi-layer ceramic substrate) including a plurality of ceramic layers that are laminated and including in an internal portion thereof, for example, an inner conductor for forming required circuits or a via-hole conductor for interlayer connection between inner conductors is used.

The ceramic substrate (multi-layer ceramic substrate) is formed in the following way. For example, ceramic green sheets having internal conductor patterns formed on their surfaces by, for example, screen printing, ceramic green sheets having via-hole conductors for interlayer connection formed by filling through holes that have been formed with conductors, and ceramic green sheets serving as outer layers that do not have conductor patterns are appropriately combined and laminated in a predetermined order. After press-bonding the ceramic green sheets, they are fired.

Surface electrodes for mounting surface mount devices or connecting straight terminals may be formed after the firing. Depending upon the circumstances, it is possible to previously form conductor patterns on the ceramic green sheets serving as outer layers of the ceramic substrate, and form surface electrodes simultaneously in the step of firing the entire structure.

However, methods for producing the ceramic substrate and specific structures thereof are not particularly limited. It is possible to use ceramic substrates having various structures produced by various publicly known methods.

When a ceramic substrate is used, a low temperature co-fired ceramic (LTCC) substrate having a particularly low firing temperature may be used.

A substrate that may be used as the core parent substrate 10 is not limited to a ceramic substrate. For example, a resin substrate may also be used.

Figure 4:
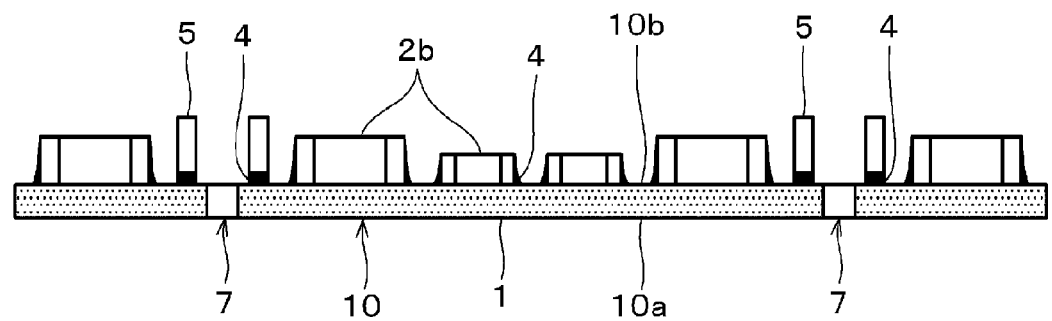
FIG. 4 illustrates a step of producing the multi-layer substrate according to the first embodiment of the present invention, in which a surface mount device is mounted and a straight terminal is disposed on another principal surface of a core parent substrate.

(2) Then, as shown in FIG. 4, a surface mount device (in the embodiment, for example, a passive chip component such as a capacitor) 2b is mounted on, of principal surfaces 10a and 10b of the core parent substrate 10, the principal surface 10b, by soldering or the like.

(3) Next, straight terminals 5 are connected to the principal surface 10b of the core parent substrate 10 using solder 4 (see FIG. 4).

Figure 5:
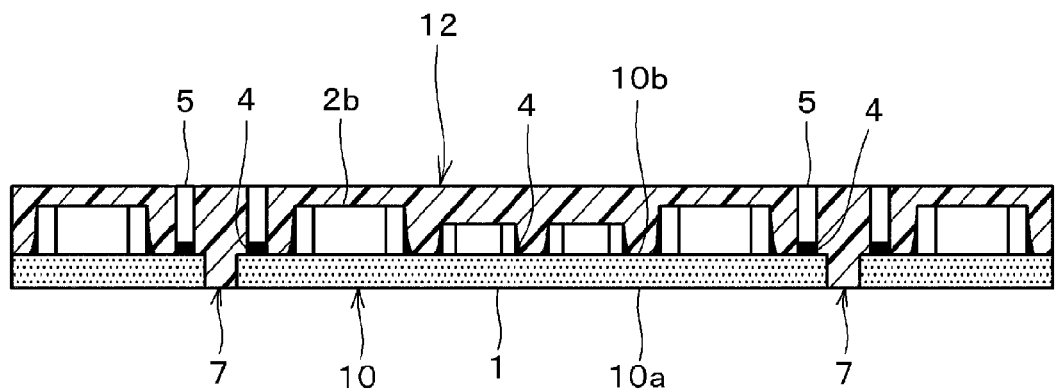
FIG. 5 is a sectional view of another step of producing the multi-layer substrate according to the first embodiment of the present invention, in which a resin layer is formed on the other principal surface of the core parent substrate.

(4) Then, as shown in FIG. 5, a resin layer 12 is disposed on the principal surface 10b of the core parent substrate 10 and is partially cured. At this time, the resin that forms the resin layer 12 is caused to fill through holes 7 and is partially cured, with the through holes 7 being used for joining and integrating the resin layers 11 and 12 to each other.

Here, as a material for forming the resin layer, for example, liquid epoxy resin mixed with inorganic filler such as $Al_2O_3$, $SiO_2$, or $TiO_2$ is used. After placing the epoxy resin on the principal surface 10b of the core parent substrate 10, the epoxy resin is partially cured by thermally treating it at 100° C. for 90 minutes. As mentioned below, the main curing of the resin layers 11 and 12 is performed at 150° C. for 60 minutes.

In the present invention, the resins that can be used for forming the resin layer include, for example, phenol resin and cyanate resin, in addition to epoxy resin. In addition, instead of liquid epoxy resin, solid resin may be used.

Figure 6:
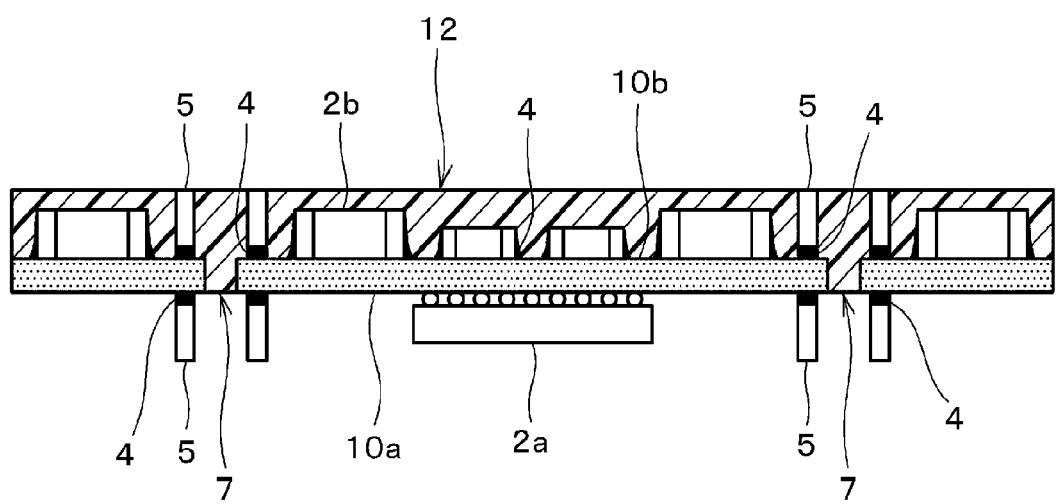
FIG. 6 is a sectional view of still another step of producing the multi-layer substrate according to the first embodiment of the present invention, in which a surface mount device is mounted and a straight terminal is disposed on one of principal surfaces of the core parent substrate.

(5) Next, as shown in FIG. 6, a surface mount device (in the embodiment, an active chip component such as a semiconductor device) 2a is mounted on the opposite principal surface (one principal surface) of the core parent substrate 10 by flip-chip mounting.

(6) Next, straight terminals 5 are connected to the principal surface 10a of the core parent substrate 10 using solder 4 (see FIG. 6).

Figure 7:
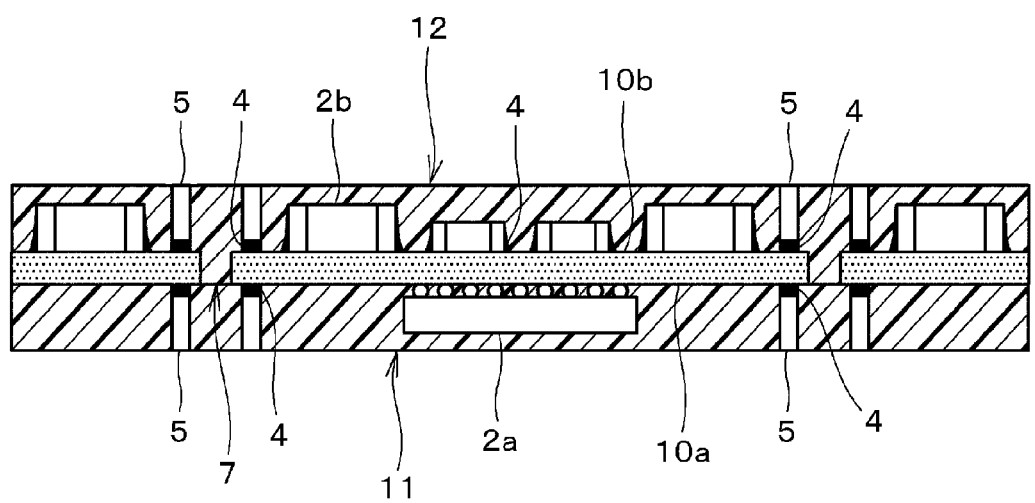
FIG. 7 is a sectional view of still another step of producing the multi-layer substrate according to the first embodiment of the present invention, in which a resin layer is formed on the one of the principal surfaces of the core parent substrate.

(7) Then, as shown in FIG. 7, the resin layer 11 is placed on the principal surface 10a of the core parent substrate 10 and is partially cured. At this time, as a material used for forming the resin layer, a material that is the same as that used for forming the resin layer 12 is used to form and partially cure the resin layer 11 using the same method.

In this step, the resin layer 11 is joined to the resin layer 12 that fills in the through holes 7. However, at this stage, the resin layers 11 and 12 are still in a partially cured state.

Figure 8:
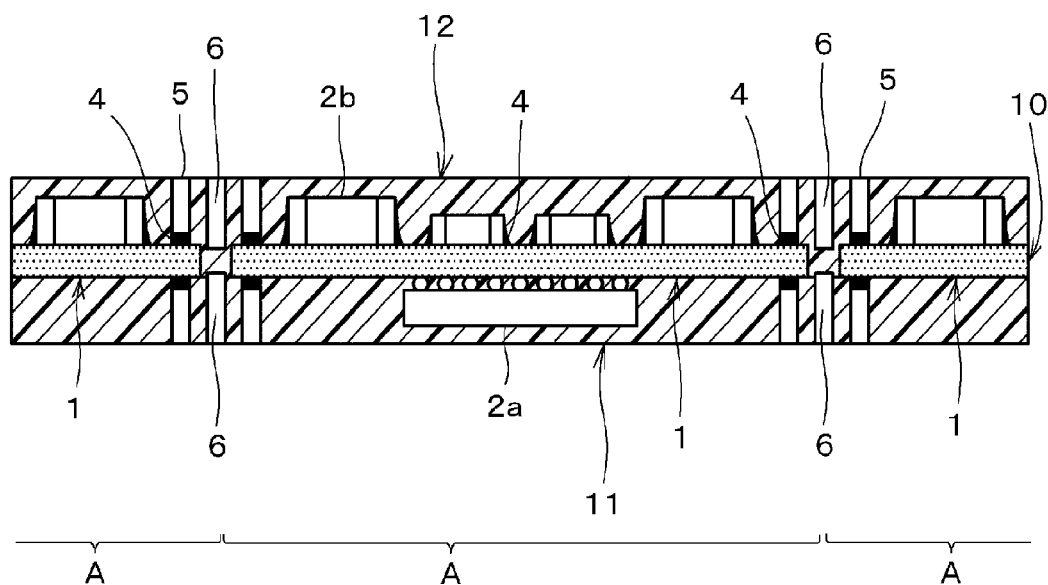
FIG. 8 is a sectional view of still another step of producing the multi-layer substrate according to the first embodiment of the present invention, in which division grooves are formed in the resin layers.

(8) Thereafter, as shown in FIG. 8, division grooves 6 for dividing the core parent substrate 10 into core individual substrates 1 are formed.

By laser machining, the division grooves 6 are formed so as to extend from the side of the partially cured resin layer 11 to the surfaces of the core parent substrate 10 and to the portions (at the shallow positions) of the core parent substrate 10 in a thickness direction, and so as to extend from the side of the resin layer 12 to the surface of the core parent substrate 10 and to the portions (at the shallow positions) of the core parent substrate 10 in a thickness direction. Since the division grooves 6 are formed so as to reach the portions (at the shallow positions) of the core parent substrate 10 in the thickness direction, as shown in FIG. 8, the division grooves 6 reach the resin layers in the internal portions of the through holes 7 of the core parent substrate 10 at the positions where the through holes 7 of the core parent substrate 10 are formed.

When the core parent substrate 10 is thin or is formed of a fragile material, in order to prevent the core parent substrate 10 from being divided while it is being produced, it may be desirable that the division grooves 6 reach the core parent substrate 10 but do not extend into the core parent substrate 10.

(9) Next, the core parent substrate 10 is placed in an oven and heated to a predetermined temperature, so that the partially cured resin layers 11 and 12 are subjected to main curing. The main curing of the resin layers 11 and 12 are performed at 150° C. for 60 minutes.

Then, the core parent substrate 10 is divided into core individual substrates 1 along the division grooves 6 to provide multi-layer substrates A having structural features such as those shown in FIGS. 1 to 3.

In producing the aforementioned multi-layer substrates A, the order of the specific steps, i.e., the above-described steps (1) to (9) may be changed.

For example, the order of the above-described steps (1) to (9) may be changed to the steps (1), (2), (3), (5), (6), (4), (7), (8), and (9).

Further, each of the above-described steps (1) to (9) may be executed in a mode differing from those exemplified above.

Each of the multi-layer substrates A is produced by performing a production process such as that described above. In addition, the resin layers 11 and 12 are placed on the corresponding principal surfaces 1a and 1b of the core individual substrate 1, and are joined and integrated to each other at the recessed portions P (the predetermined regions formed by dividing the aforementioned through holes 7) (FIG. 3) formed at locations corresponding to the central portions of the corresponding sides S at the peripheral edge portions thereof. Therefore, it is possible to effectively suppress or prevent the warping of the core individual substrates 1 in the step of curing the resin layer 11 and the step of curing the resin layer 12.

The resulting multi-layer substrate is not warped, is excellent in mounting it onto a mother board, and has the core individual substrate and the resin layers joined in a highly reliable manner.

Since the warping of the core individual substrate 1 is suppressed or prevented, it is possible to prevent the disconnection of, for example, a circuit wire formed on the multi-layer substrate A.

Since the resin layers that are disposed on both principal surfaces of the core individual substrate are joined and integrated to each other, when stress is applied to one of the resin layers after mounting on a mother board, the stress is diffused to the other resin layer, so that it is possible to reduce the stress that is applied to the core individual substrate. Consequently, it is possible to suppress the splitting or chipping of the core individual substrate, and to suppress the variations in the characteristics of the multi-layer substrate. In addition, the flexure deformation is easily absorbed, and the flexure deformation strength is increased.

In the above-described embodiment, as shown in FIG. 3, the resin layers 11 and 12 are joined and integrated to each other at the recessed portions P (the predetermined areas) formed at the locations corresponding to the central portions of the corresponding sides S (the four sides) of the core individual substrate 1. However, it is possible for the planar shape of the core individual substrate 1 obtained by dividing the core parent substrate 10 to be any one of the shapes shown in FIGS. 9, 10, and 11, and the resin layers 11 and 12 to be joined and integrated to each other at the predetermined regions P shown in FIG. 9, 10, or 11.

Figure 10:
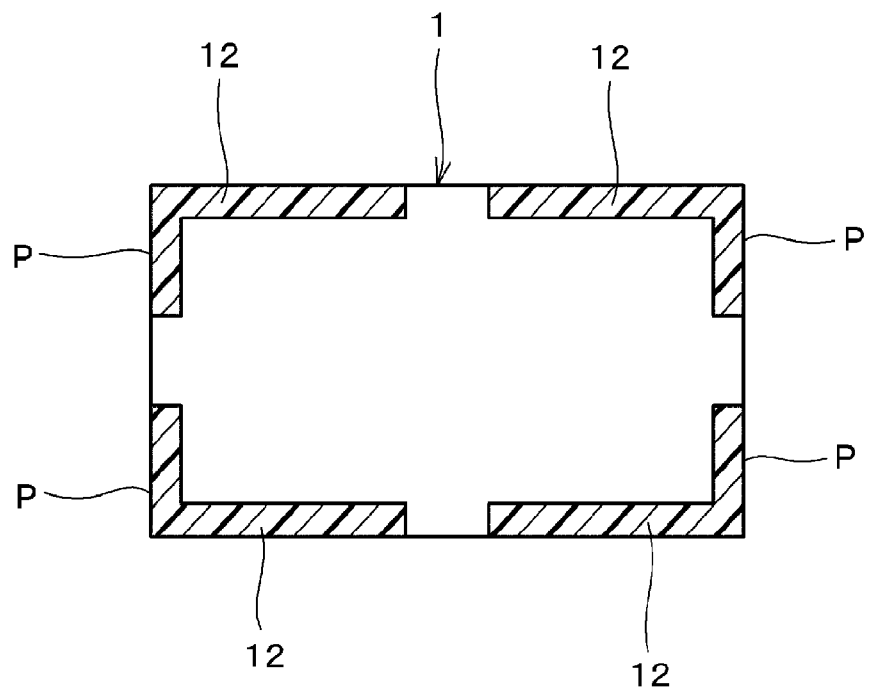
FIG. 10 is a plan sectional view of another modification of the multi-layer substrate according to the first embodiment of the present invention.
Figure 11:
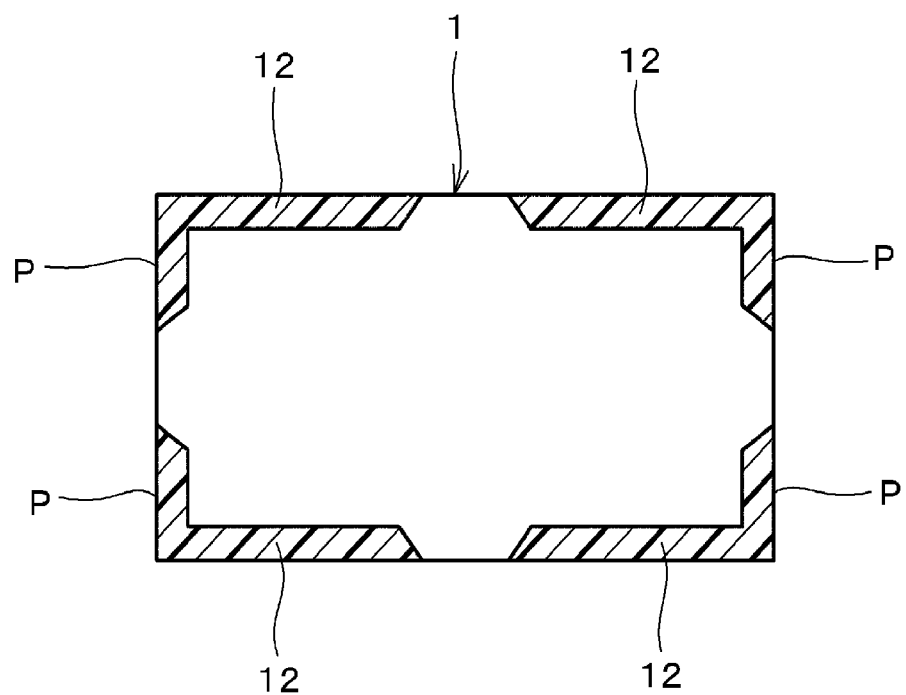
FIG. 11 is a plan sectional view of still another modification of the multi-layer substrate according to the first embodiment of the present invention.

In particular, when the predetermined regions P are provided so as to cover the corners of the core individual substrate as shown in FIGS. 10 and 11, it is possible to suppress the splitting and chipping of the core individual substrate.

In FIG. 1, a shield layer, formed of a conductive film, may be formed on at least one of the resin layers. In particular, when the shield layer is formed so as to cover the portions of the side surfaces of the core individual substrate, a short circuit may occur between the shield layer and the surface mount device. However, when the predetermined regions P are disposed at such locations, it is possible to suppress the occurrence of short circuits. In addition, since the adhesion of the shield layer with respect to the resin layer is greater than the core individual substrate, it is possible to increase the adhesion of the shield layer by providing the predetermined regions P.

Figure 9:
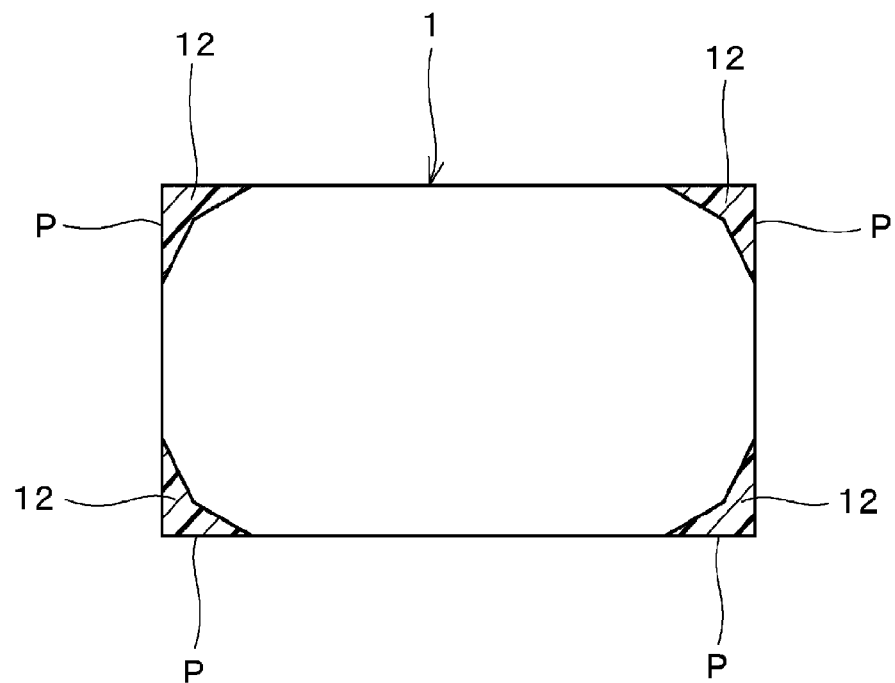
FIG. 9 is a plan sectional view of a modification of the multi-layer substrate according to the first embodiment of the present invention.

It is possible to produce any one of the multi-layer substrates having the structures shown in FIGS. 9 to 11 by the same method as that used in the first embodiment by forming the through holes 7 (the penetration regions) (see, for example, FIG. 4), where the predetermined areas P having a shape shown in the corresponding one of FIGS. 9 to 11 are formed, when the core parent substrate 10 is divided into core individual substrates 1.

Figure 12:
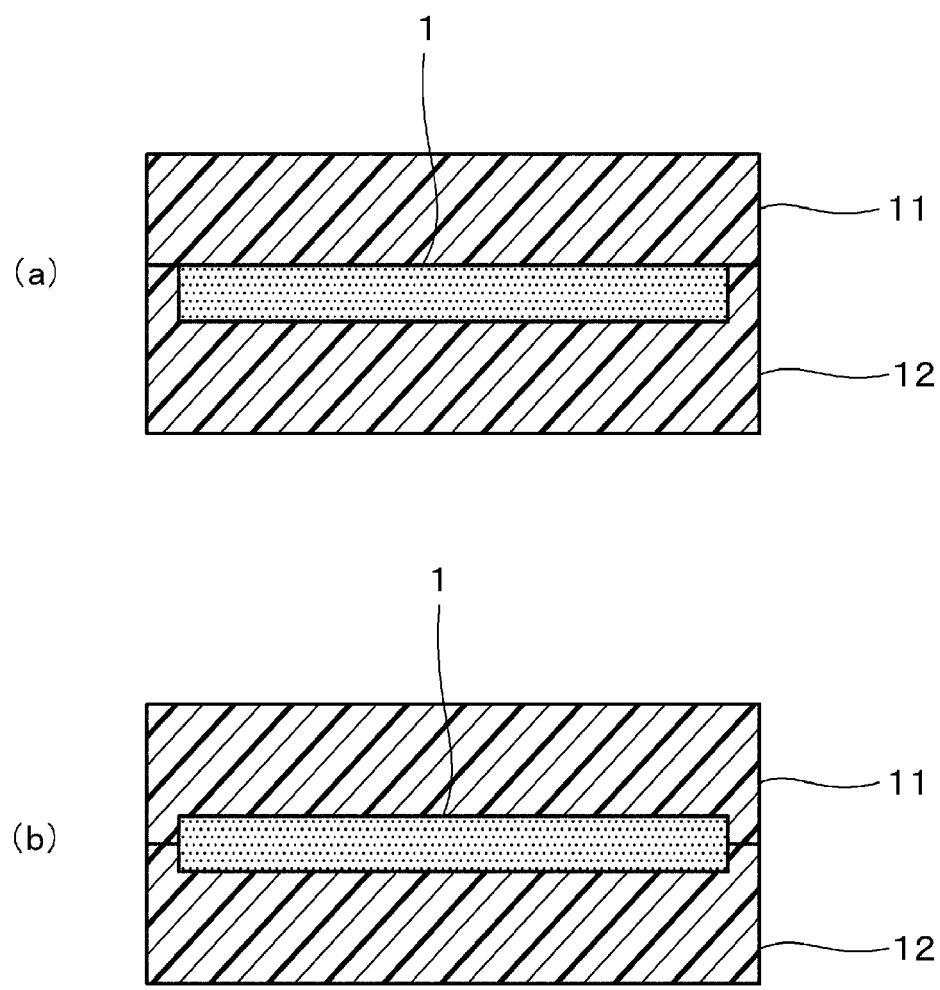
FIGS. 12(a) and 12(b) each illustrate a state in which the resin layers disposed on both principal surfaces of a core individual substrate are joined and integrated to each other.

FIGS. 12(a) and 12(b) each illustrate a state in which the resin layers 11 and 12 disposed on both principal surfaces of the core individual substrate 1 are joined and integrated to each other. However, for facilitating understanding, FIGS. 12(a) and 12(b) only show the core individual substrate 1 and the resin layers 11 and 12, with the other structural features not being shown.

In the above-described embodiment, in one step (the aforementioned step (4)) of the method for producing the multi-layer substrate, the entire area of each through hole 7 is filled with the resin for forming the resin layer 12, after which, in the aforementioned step (7), the resin layer 11 is formed. In this case, the mode of joining the resin layers 11 and 12 is as shown in FIG. 12(a). That is, when the resin layer 11 is formed with the entire through holes 7 being filled with the resin for forming the resin layer 12, (the resin of) the resin layer 11 is joined to a surface of the resin for forming the resin layer 12 that fills in the entire through holes 7. The resin layers 11 and 12 are integrated to each other in the following step of subjecting the resin layers 11 and 12 to main curing, and are formed into a state such as that shown in FIG. 12(a).

In contrast, when, in the aforementioned step (4), the through holes 7 are partially filled with the resin for forming the resin layer 12, and when, in the aforementioned step (7), in forming the resin layer 11, the through holes 7 are partially filled with the resin for forming the resin layer 11, the resin layers 11 and 12 are integrally joined to each other in a mode such as that shown in FIG. 12(b).

In the present invention, the mode of joining the resin layers 11 and 12 may be either one of the modes shown in FIGS. 12(a) and 12(b).

Second Embodiment

Figure 13:
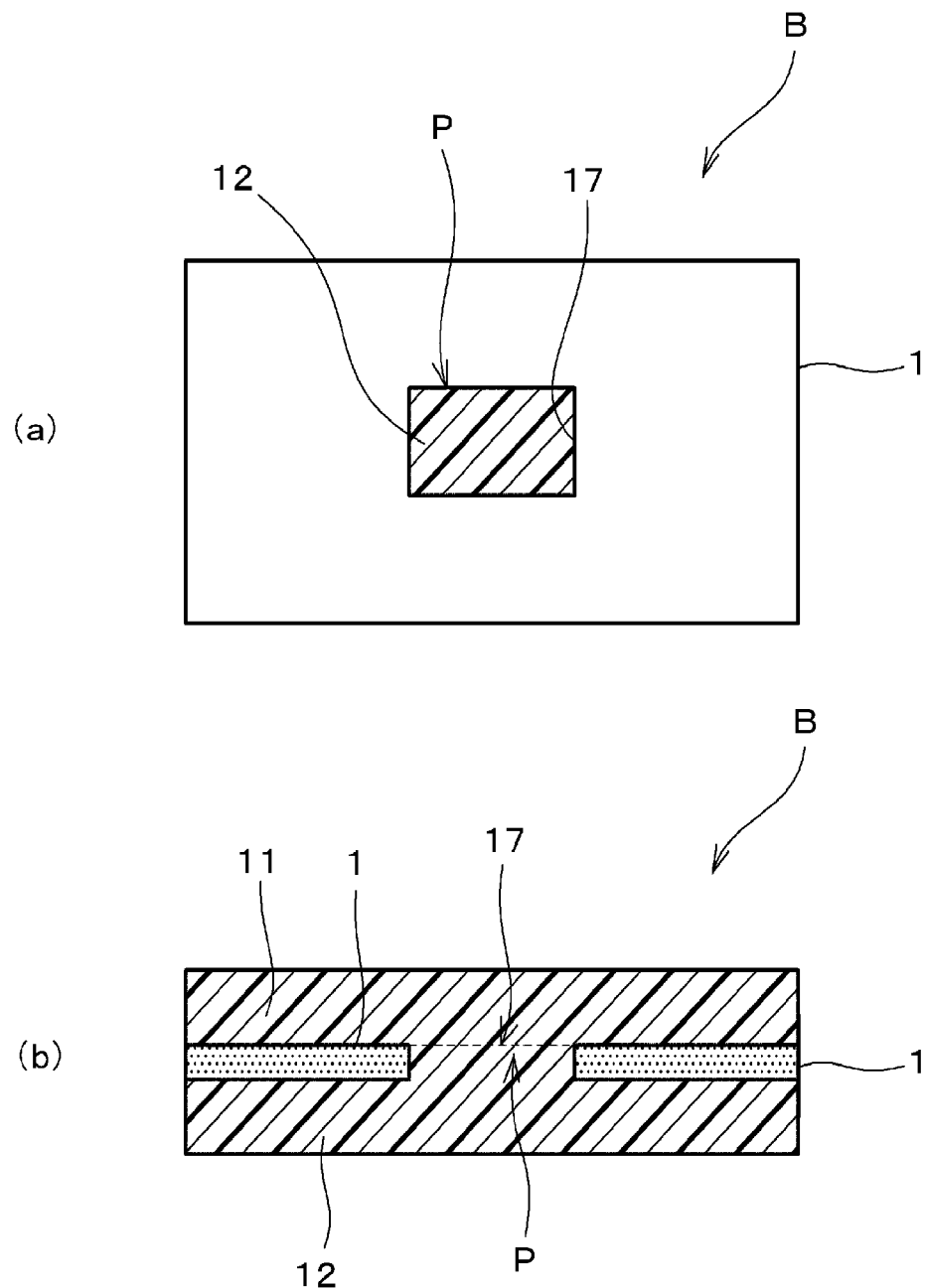
FIG. 13 schematically illustrates a structure of a multi-layer substrate according to another embodiment (second embodiment) of the present invention, with FIG. 13(a) being a plan sectional view and FIG. 13(b) being a front sectional view.
Figure 14:
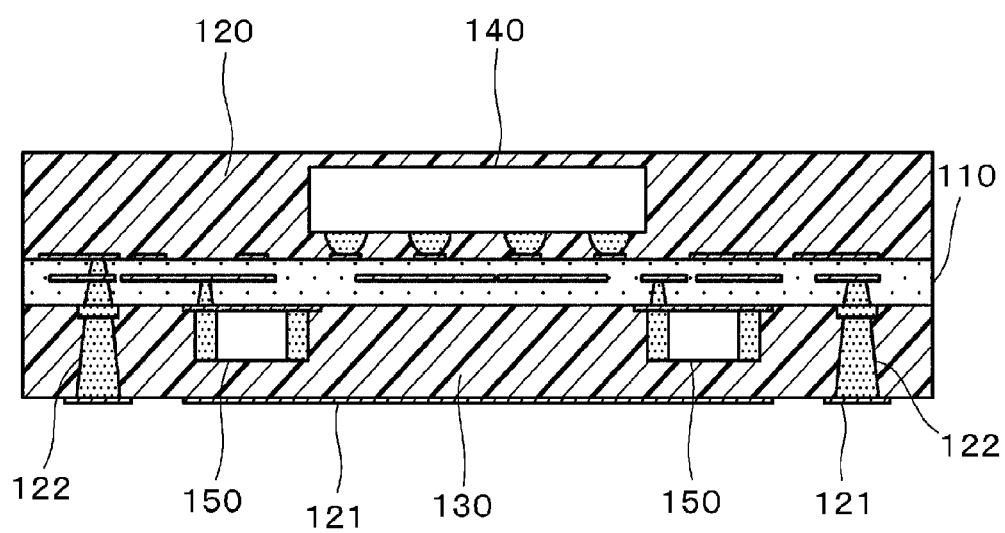
FIG. 14 is a front sectional view of a structure of an existing multi-layer substrate.

FIGS. 13(a) and 13(b) show a multi-layer substrate B according to another embodiment (second embodiment) of the present invention. For facilitating understanding, FIGS.

13(a) and 13(b) only show a core individual substrate 1 and resin layers 11 and 12, with the other structural features not being shown.

As shown in FIGS. 13(a) and 13(b), in the multi-layer substrate B according to the second embodiment, the resin layers 11 and 12, formed on both principal surfaces of the core individual substrate 1, are integrally joined to each other via a through hole 17 that extends through the core individual substrate 1.

Even the structure according to the second embodiment can provide effects that are similar to those provided by the first embodiment.

The multi-layer substrate B according to the second embodiment may be produced by a method that is in accordance with the producing method according to the first embodiment. That is, when forming through holes in the core parent substrate, the through holes are formed so as to extend through regions of the core individual substrates included in the core parent substrate and so as not to exist on a division line. This makes it possible to produce the multi-layer substrate B according to the second embodiment by a method that is in accordance with the producing method according to the first embodiment.

Further, the present invention is not limited to the above-described embodiments on other points. Various applications and modifications may be made within the scope of the present invention regarding, for example, specific structures of the core parent substrate and the core individual substrate, types and mounting modes of the surface mount devices to be mounted, types of materials of the resin layers, modes of disposing the predetermined regions where the resins on both principal surfaces of the core parent substrate are to be integrated to each other, conditions under which the resin layers are subjected to partial curing and main curing, and specific methods for dividing the core parent substrate into core individual substrates.

1 core individual substrate
1a one principal surface of core individual substrate
1b other principal surface of core individual substrate
2a, 2b surface mount device
4 solder
5 straight terminal
6 division groove
7 through hole
10 core parent substrate
10a one principal surface of core parent substrate
10b other principal surface of core parent substrate
11, 12 resin layer
A, B multi-layer substrate
P predetermined region
S side

The invention claimed is:

1. A method for producing a multi-layer substrate including sealing resin layers disposed on both of principal surfaces of a core individual substrate, the method comprising:

(a) a step of mounting first surface mount devices on a first principal surface of a core parent substrate, wherein the core parent substrate includes a plurality of the core individual substrates and has through holes formed in each of the core individual substrates so as to extend therethrough;

(b) a first resin layer forming step of forming a first partially cured resin layer on the first principal surface and filling the through holes with the first resin layer so that the first surface mount devices are sealed with the first resin layer;

(c) a step of mounting second surface mount devices on a second principal surface of the core parent substrate, wherein the second principal surface is opposed to the first principal surface;

(d) a second resin layer forming step of forming a second partially cured resin layer on the second principal surface so that the second surface mount devices are sealed with the second resin layer and the first partially cured resin layer and the second partially cured resin layer are joined and integrated to each other at a predetermined region of the through holes;

(e) a main curing step of completely curing the first partially cured resin layer and the second partially cured resin layer formed on the core parent substrate; and (f) a dividing step of dividing at a predetermined position the core parent substrate provided with the first and second resin layers completely cured in the main curing step to separate the core parent substrate into each core individual substrate.

2. The method for producing a multi-layer substrate according to claim 1, wherein, in order for the first and second resin layers on the first and second principal surfaces of each core individual substrate to be joined and integrated to each other at the predetermined region at a peripheral edge portion, each of the through holes is formed so as to cut away a portion of an outer peripheral edge of each of the core individual substrates included in the core parent substrate.

3. The method for producing a multi-layer substrate according to claim 1, wherein, in order for the first and second resin layers on the first and second principal surfaces of each core individual substrate to be joined and integrated to each other at a penetration region of the associated core individual substrate, each of the through holes is formed so as to extend into a region of each of the core individual substrates included in the core parent substrate.

4. The method for producing a multi-layer substrate according to claim 1, further comprising, between the second resin layer forming step (d) and the main curing step (e), a step of forming, as division grooves for dividing the core parent substrate into the core individual substrates, grooves extending from a side of the partially cured first and second resin layers to the core parent substrate.

* * * * *